(12) United States Patent
Rossin

(10) Patent No.: US 7,830,938 B2
(45) Date of Patent: Nov. 9, 2010

(54) LASER DIODE

(75) Inventor: Victor Rossin, Mountain View, CA (US)

(73) Assignee: JDS Uniphase Corporation, Milpitas, CA (US)

( * ) Notice: Subject to any disclaimer, the term of this patent is extended or adjusted under 35 U.S.C. 154(b) by 35 days.

(21) Appl. No.: 12/334,764

(22) Filed: Dec. 15, 2008

(65) Prior Publication Data

US 2010/0150196 A1    Jun. 17, 2010

(51) Int. Cl.
*H01S 5/00* (2006.01)
(52) U.S. Cl. ............... 372/45.01; 372/43.01; 372/46.01
(58) Field of Classification Search ............... 372/45.01
See application file for complete search history.

(56) References Cited

U.S. PATENT DOCUMENTS

| | | | |
|---|---|---|---|
| 3,855,607 A | 12/1974 | Kressel et al. | 372/45.012 |
| 5,260,959 A | 11/1993 | Hayakawa | 372/45.01 |
| 5,289,484 A | 2/1994 | Hayakawa | 372/45.01 |
| 5,923,689 A | 7/1999 | Su et al. | 372/45.01 |
| 6,373,874 B1 * | 4/2002 | Kidoguchi et al. | 372/45.01 |
| 6,522,677 B1 | 2/2003 | Petrescu-Prahova et al. | 372/45.01 |
| 6,606,334 B1 | 8/2003 | Shigihara et al. | 372/45.01 |
| 6,882,670 B2 | 4/2005 | Buda et al. | 372/46.01 |
| 6,961,358 B2 | 11/2005 | Erbert et al. | 372/45.01 |
| 6,987,788 B2 * | 1/2006 | Kim et al. | 372/45.01 |
| 6,993,053 B2 | 1/2006 | Buda et al. | 372/44.01 |
| 7,251,381 B2 | 7/2007 | Buda et al. | 385/11 |
| 7,263,114 B2 | 8/2007 | Cho | 372/45.01 |
| 2007/0002914 A1 | 1/2007 | Ryu et al. | 372/45.01 |

* cited by examiner

*Primary Examiner*—Minsun Harvey
*Assistant Examiner*—Xnning Niu
(74) *Attorney, Agent, or Firm*—Matthew A. Pequignot; Pequignot + Myers LLC

(57) ABSTRACT

The present invention provides a laser diode having both a small vertical far-field beam divergence and a large vertical optical confinement factor, as well as a method of fabricating the laser diode. The laser diode comprises a layer stack of semiconductor material, which includes a mode-splitting layer having a low refractive index inserted between waveguide layers. In addition to increasing the vertical near-field beam width of the laser diode, the mode-splitting layer also produces a shoulder in an optical mode generated in an active layer of the layer stack, increasing vertical overlap of the optical mode with the active layer.

19 Claims, 10 Drawing Sheets

LASER DIODE

TECHNICAL FIELD OF THE INVENTION

The present invention relates to laser diodes and, in particular, to laser diodes having a small vertical far-field beam divergence.

BACKGROUND OF THE INVENTION

One of the most important characteristics of a laser diode is the beam divergence of the output beam in the far field. The smaller the far-field beam divergence, the higher the brightness of the output beam. Furthermore, in applications where the output beam is coupled into an optical fiber, smaller far-field beam divergence leads to higher coupling efficiency and improved alignment tolerance.

The beam divergence of the output beam in the far field is closely related to the beam width of the output beam in the near field. The larger the near-field beam width, the smaller the far-field beam divergence.

The optical power density of the output beam at an edge facet of the laser diode is, normally, limited to a peak optical power density, above which catastrophic optical mirror damage (COMD) occurs. Advantageously, a larger near-field beam width also allows a higher optical power for a given peak optical power density.

With reference to FIG. 1, a conventional high-power laser diode 100 has an asymmetric separate-confinement structure. The laser diode 100 comprises a first metal layer 110 and a second metal layer 111 of metallic material, for passing current to or from the laser diode 100, as well as a substrate 120 and a layer stack 130 of semiconductor material.

The layer stack 130 includes, in succession, a first cladding layer 140, for confining an optical mode, a first waveguide layer 150, for propagating the optical mode, an active layer 160, for generating the optical mode, a second waveguide layer 151, for propagating the optical mode, a second cladding layer 141, for confining the optical mode, and a contact layer 170, for facilitating ohmic contacting.

Typically, the substrate 120, the first cladding layer 140, and the first waveguide layer 150 are of n-type semiconductor material, the active layer 160 is of intrinsic semiconductor material, and the second waveguide layer 151, the second cladding layer 141, and the capping layer 170 are of p-type semiconductor material.

In FIG. 2, refractive index n and optical-mode intensity I are each plotted as a function of distance x from the second metal layer 111 along a vertical axis 190 through the laser diode 100 of FIG. 1. Within the layer stack 130, the active layer 160 and the contact layer 170 have respective refractive indices that are each greater than the respective refractive indices of the other layers in the layer stack 130. The first waveguide layer 150 and the second waveguide layer 151 have a substantially equal refractive index, and the first cladding layer 140 and the second cladding layer 141 have respective refractive indices that are each less than the refractive index of the first waveguide layer 150 and the second waveguide layer 151.

To reduce optical loss due to free-carrier absorption, the refractive index of the second cladding layer 141 is less than the refractive index of the first cladding layer 140. Furthermore, the second waveguide layer 151 has a thickness that is less than a thickness of the first waveguide layer 150. Such asymmetric refractive-index and thickness profiles skew the optical mode toward the portion of the layer stack 130 that is of n-type semiconductor material, which is desirable because free-hole absorption is more problematic than free-electron absorption.

The refractive-index profile of the layer stack 130 also ensures that the optical mode generated in the active layer 160 is largely confined by the first cladding layer 140 and the second cladding layer 141 to propagate mainly in the first waveguide layer 150, the second waveguide layer 151, and the active layer 160. The optical mode is emitted as an output beam from an edge facet of the laser diode 100 perpendicular to a horizontal plane of the active layer 160.

Typically, the vertical near-field beam width, that is, the near-field beam width in a direction perpendicular to the horizontal plane of the active layer 160, is much smaller than the horizontal near-field beam width, that is, the near-field beam width in a direction parallel to the horizontal plane of the active layer 160. Therefore, the vertical far-field beam divergence is much larger than the horizontal far-field beam divergence.

To decrease the vertical far-field beam divergence, a laser diode having a large vertical near-field beam width is desired. With reference to FIG. 3, one conventional approach to increasing the vertical near-field beam width of a laser diode 300 is to increase the thickness of a first waveguide layer 350 included in a layer stack 330 that is otherwise similar to that of the laser diode 100.

In FIG. 4, refractive index n and optical-mode intensity I are each plotted as a function of distance x from the second metal layer 111 along a vertical axis 390 through the laser diode 300 of FIG. 3. Comparison of FIG. 4 with FIG. 2 reveals that, in the laser diode 300, the vertical intensity profile of the optical mode is wider than that in the laser diode 100. Thus, the increased thickness of the first waveguide layer 350 leads to an increased vertical near-field beam width and a decreased vertical far-field beam divergence of the laser diode 300 relative to those of the laser diode 100. However, as a result, vertical overlap of the optical mode with the active layer 160 in the laser diode 300 is decreased relative to that in the laser diode 100, leading to a decreased vertical optical confinement factor of the laser diode 300 relative to that of the laser diode 100.

Another approach to increasing the vertical near-field beam width of a laser diode involves inserting a mode-attracting layer having a high refractive index into a layer stack similar to that of the laser diode 100. A mode-attracting layer may be inserted between a cladding layer and a waveguide layer, as disclosed in U.S. Pat. No. 6,961,358 to Erbert, et al., issued on Nov. 1, 2005; and in U.S. Pat. No. 6,522,677 to Petrescu-Prahova, et al., issued on Feb. 18, 2003; for example, which are incorporated herein by reference. Alternatively, a mode-attracting layer may be inserted between cladding layers, as disclosed in U.S. Pat. No. 6,987,788 to Kim, et al., issued on Jan. 17, 2006; and in U.S. Pat. No. 5,923,689 to Su, et al., issued on Jul. 13, 1999; for example, which are incorporated herein by reference.

Yet another approach to increasing the vertical near-field beam width of a laser diode involves inserting a mode-repelling layer having a low refractive index into a layer stack similar to that of the laser diode 100. A mode-repelling layer may be inserted between a cladding layer and a waveguide layer, as disclosed in U.S. Pat. No. 7,263,114 to Cho, issued on Aug. 28, 2007; and in U.S. Pat. No. 6,606,334 to Shigihara, et al., issued on Aug. 12, 2003; for example, which are incorporated herein by reference. Alternatively, a mode-repelling layer may be inserted between cladding layers, as disclosed in U.S. Pat. No. 5,289,484 to Hayakawa, issued on Feb. 22, 1994; and in U.S. Pat. No. 5,260,959 to Hayakawa, issued on Nov. 9, 1993; for example, which are incorporated herein by reference.

Yet another approach to increasing the vertical near-field beam width of a laser diode involves inserting both a mode-attracting layer having a high refractive index and a mode-repelling layer having a low refractive index into a layer stack similar to that of the laser diode 100. A mode-attracting layer and a mode-repelling layer may be inserted between a cladding layer and a waveguide layer having a graded refractive index, as disclosed in U.S. Pat. No. 7,251,381 to Buda, et al., issued on Jul. 31, 2007; in U.S. Pat. No. 6,993,053 to Buda, et al., issued on Jan. 31, 2006; and in U.S. Pat. No. 6,882,670 to Buda, et al., issued on Apr. 19, 2005; for example, which are incorporated herein by reference.

Although such prior-art laser diodes, generally, have a small vertical far-field beam divergence, many also have a small vertical optical confinement factor. An object of the present invention is to overcome the shortcomings of the prior art by providing a laser diode having both a small vertical far-field beam divergence and a large vertical optical confinement factor. In the laser diode of the present invention, a mode-splitting layer having a low refractive index is inserted between waveguide layers of a layer stack similar to that of the laser diode 100 to increase the vertical near-field beam width. The mode-splitting layer also produces a shoulder in an optical mode generated in an active layer of the layer stack, increasing vertical overlap of the optical mode with the active layer.

SUMMARY OF THE INVENTION

Accordingly, the present invention relates to a laser diode comprising: a layer stack of semiconductor material, including, in succession: a first cladding layer, for confining an optical mode; a first waveguide layer, for propagating the optical mode; a mode-splitting layer, for splitting the optical mode; a second waveguide layer, for propagating the optical mode; an active layer, for generating the optical mode; a third waveguide layer, for propagating the optical mode; and a second cladding layer, for confining the optical mode; wherein the first waveguide layer, the second waveguide layer, and the third waveguide layer have a substantially equal refractive index; and wherein the first cladding layer, the mode-splitting layer, and the second cladding layer have respective refractive indices that are each less than the refractive index of the first waveguide layer, the second waveguide layer, and the third waveguide layer.

Another aspect of the present invention relates to a method of fabricating a laser diode comprising: providing a substrate of semiconductor material; and epitaxially growing a layer stack of semiconductor material on a top surface of the substrate, including: epitaxially growing a first cladding layer, for confining an optical mode; epitaxially growing a first waveguide layer, for propagating the optical mode, on a top surface of the first cladding layer; epitaxially growing a mode-splitting layer, for splitting the optical mode, on a top surface of the first waveguide layer; epitaxially growing a second waveguide layer, for propagating the optical mode, on a top surface of the mode-splitting layer; epitaxially growing an active layer, for generating the optical mode, on a top surface of the second waveguide layer; epitaxially growing a third waveguide layer, for propagating the optical mode, on a top surface of the active layer; and epitaxially growing a second cladding layer, for confining the optical mode, on a top surface of the third waveguide layer; wherein the first waveguide layer, the second waveguide layer, and the third waveguide layer have a substantially equal refractive index; and wherein the first cladding layer, the mode-splitting layer, and the second cladding layer have respective refractive indices that are each less than the refractive index of the first waveguide layer, the second waveguide layer, and the third waveguide layer.

BRIEF DESCRIPTION OF THE DRAWINGS

The present invention will be described in greater detail with reference to the accompanying drawings, wherein.

DETAILED DESCRIPTION OF THE INVENTION

The present invention provides a laser diode having both a small vertical far-field beam divergence and a large vertical optical confinement factor. The advantageous features of the laser diode provided by the present invention will be described herein in the context of exemplary, preferred embodiments of the laser diode. However, those skilled in the art will appreciate that these advantageous features could also be applied to laser diodes having other specific structures.

Figure 5:
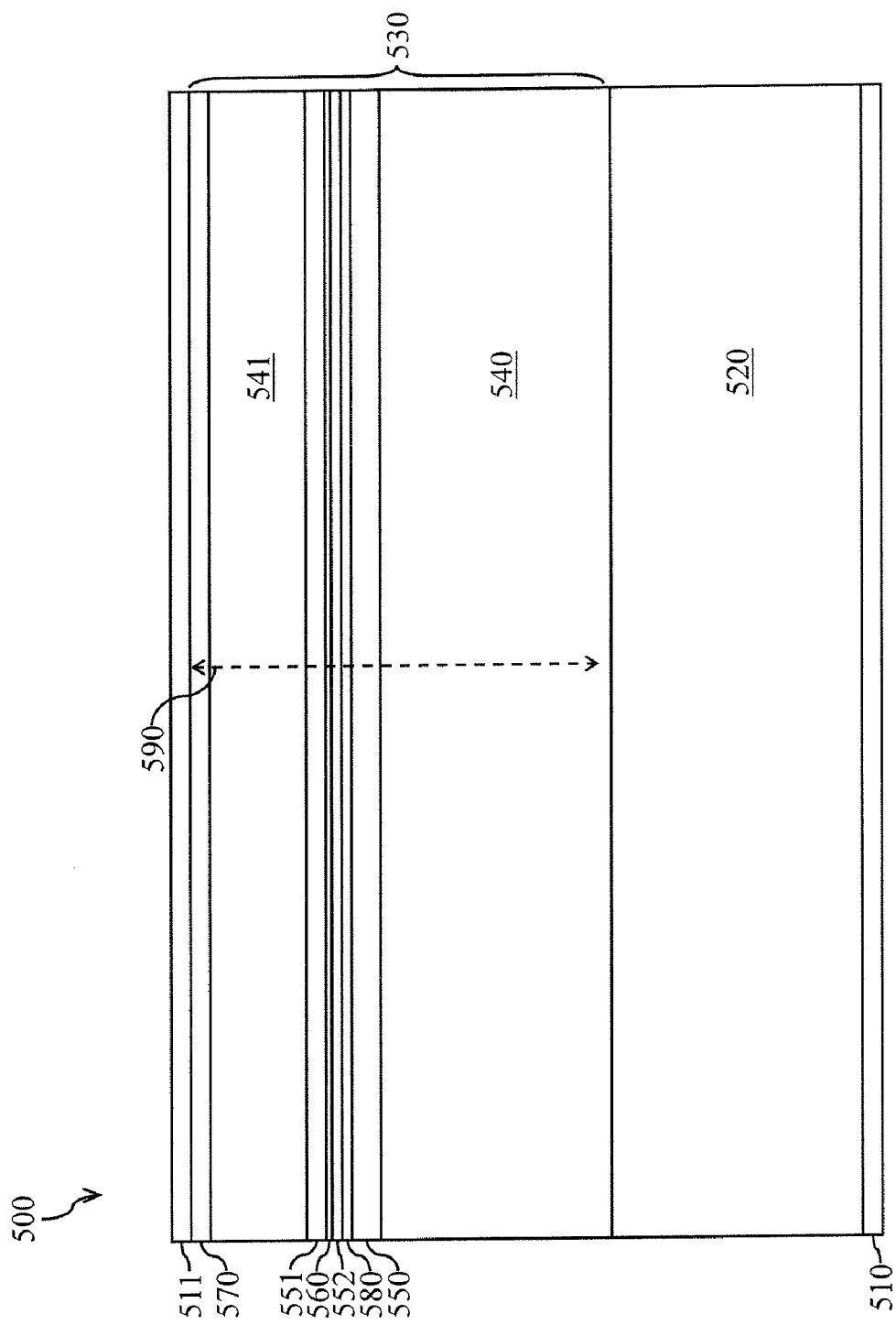
FIG. 5 is a schematic illustration of a cross-section of a laser diode according to a first embodiment of the present invention.

With reference to FIG. 5, a laser diode 500 according to a first embodiment of the present invention has an asymmetric separate-confinement structure similar to that of the prior-art laser diode 100. The laser diode 500, typically, comprises a first metal layer 510 and a second metal layer 511 of metallic material, for passing current to or from the laser diode 500, as well as a substrate 520 and a layer stack 530 of semiconductor material.

Typically, the first metal layer 510 is disposed on a bottom surface of the substrate 520, and the second metal layer 511 is disposed on a top surface of the layer stack 530. The first metal layer 510 and the second metal layer 511 are, preferably, of one or more metals or metal alloys.

Preferably, the layer stack 530 is disposed on a top surface of the substrate 520. The layer stack 530 includes, in succession, a first cladding layer 540, for confining an optical mode, a first waveguide layer 550, for propagating the optical mode, a mode-splitting layer 580, for splitting the optical mode, a second waveguide layer 552, for propagating the optical mode, an active layer 560, for generating the optical mode, a third waveguide layer 551, for propagating the optical mode, and a second cladding layer 541, for confining the optical mode. Preferably, the layer stack 530 includes said layers in direct succession with no intervening layers. Typically, the layer stack 530 also includes a contact layer 570, for facilitating ohmic contacting. Preferably, the layer stack 530 includes the contact layer 570 in succession to the second cladding layer 541. More preferably, the layer stack 530 includes the contact layer 570 in direct succession to the second cladding layer 541. In some instances, the layer stack 530 includes additional layers.

Typically, the active layer 560 includes an active strip, preferably, having a width of about 100 μm. In some instances, the laser diode 500 has a ridge structure, in which the active strip is defined by etching of a ridge, as is well-known to those skilled in the art. In other instances, the laser diode 500 has planar structure, in which the active strip is defined by ion implantation, dopant diffusion, or epitaxial regrowth, as is also well-known to those skilled in the art.

Preferably, within the layer stack 530, the first waveguide layer 550 is disposed on a top surface of the first cladding layer 540, the mode-splitting layer 580 is disposed on a top surface of the first waveguide layer 550, the second waveguide layer 552 is disposed on a top surface of the mode-splitting layer 580, the active layer 560 is disposed on a top surface of the second waveguide layer 552, the third waveguide layer 551 is disposed on a top surface of the active layer 560, and the second cladding layer 541 is disposed on a top surface of the third waveguide layer 551. More preferably, the first cladding layer 540 is disposed at a bottom of the layer stack 530, and the contact layer 570 is disposed on a top surface of the second cladding layer 541 at a top of the layer stack 530.

Preferably, the first cladding layer 540 has a thickness of about 1.0 μm to 3.5 μm, the first waveguide layer 550 has a thickness of about 0.2 μm to 1.0 μm, the mode-splitting layer 580 has a thickness of about 0.05 μm to 0.4 μm, the second waveguide layer 552 has a thickness of about 0.1 μm to 0.3 μm, the active layer 560 has a thickness of about 10 nm, the third waveguide layer 551 has a thickness of about 0.2 μm to 0.4 μm, the second cladding layer 541 has a thickness of about 0.5 μm to 2.0 μm, and the contact layer 570 has a thickness of about 0.2 μm. More preferably, the mode-splitting layer 580 has a thickness of about 0.1 μm to 0.2 μm.

Typically, the substrate 520, the first cladding layer 540, the first waveguide layer 550, the mode-splitting layer 580, and the second waveguide layer 552 are of n-type semiconductor material, the active layer 560 is of intrinsic semiconductor material, and the third waveguide layer 551, the second cladding layer 541, and the contact layer 570 are of p-type semiconductor material.

The substrate 520 is, preferably, of an n-type III-V semiconductor compound, which, typically, includes a donor dopant of Group VI, such as sulfur, selenium, or tellurium, or of Group IV, such as carbon, silicon, or germanium. In a preferred embodiment, the substrate 520 is of n-type GaAs and has a refractive index of about 3.55 at 940 nm, for example.

The first cladding layer 540, the first waveguide layer 550, the mode-splitting layer 580, and the second waveguide layer 552 are also, preferably, of an n-type III-V semiconductor compound. In a preferred embodiment, the first cladding layer 540, the first waveguide layer 550, the mode-splitting layer 580, and the second waveguide layer 552 are of n-type $Ga_{1-x}Al_xAs$ ($0 \leqq x \leqq 1$), hereafter referred to as GaAlAs. Typically, in such an embodiment, the first cladding layer 540 is of n-type GaAlAs with x of about 0.3 to 0.5 and has a refractive index of about 3.23 to 3.35 at 940 nm, for example, the first waveguide layer 550 and the second waveguide layer 552 are of n-type GaAlAs with x of about 0.1 to 0.3 and have a refractive index of about 3.35 to 3.48 at 940 nm, for example, and the mode-splitting layer 580 is of n-type GaAlAs with x of about 0.2 to 0.5 and has a refractive index of about 3.23 to 3.41 at 940 nm, for example.

The active layer 560 includes one or more quantum-well layers. In some instances, the active layer 560 includes a single quantum-well layer, which is, preferably, of an intrinsic III-V semiconductor compound. The semiconductor material of the quantum-well layer is selected to have a band-gap energy corresponding to a desired lasing wavelength. In a preferred embodiment, the single quantum-well layer is of intrinsic $In_xGa_{1-x}As$ ($0 \leqq x \leqq 1$), hereafter referred to as InGaAs. Typically, in such an embodiment, the single quantum-well layer is of intrinsic InGaAs with x of about 0.05 to 0.15, has a lasing wavelength of about 915 nm to 980 nm, and has a refractive index of about 3.6 to 3.7 at 940 nm, for example.

In other instances, the active layer 560 includes multiple quantum-well layers, which are also, preferably, of an intrinsic III-V semiconductor compound. The multiple quantum-well layers are separated by one or more barrier layers, which are, preferably, of a different intrinsic III-V semiconductor compound. As mentioned heretofore, the semiconductor material of the multiple quantum-well layers is selected to have a band-gap energy corresponding to the desired lasing wavelength. The semiconductor material of the one or more barrier layers is selected to have a larger band-gap energy, such that the one or more barrier layers act as potential barriers to confine electrons in the multiple quantum-well layers. In a preferred embodiment, the multiple quantum-well layers are of intrinsic InGaAs, and the one or more barrier layers are of intrinsic GaAlAs. Typically, in such an embodiment, the multiple quantum-well layers are of intrinsic InGaAs with x of about 0.05 to 0.15, have a lasing wavelength of about 915 nm to 980 nm, and have a refractive index of about 3.6 to 3.7 at 940 nm, for example, and the one or more barrier layers are of intrinsic GaAlAs with x of about 0 to 0.3 and have a refractive index of about 3.35 to 3.55 at 940 nm, for example.

The third waveguide layer 551 and the second cladding layer 541 are, preferably, of a p-type III-V semiconductor compound, which, typically, includes an acceptor dopant of Group II, such as beryllium, zinc, or cadmium, or of Group IV, such as carbon, silicon, or germanium. In a preferred embodiment, the third waveguide layer 551 and the second cladding layer 541 are of p-type GaAlAs. Typically, in such an embodiment, the third waveguide layer 551 is of p-type GaAlAs with x of about 0.1 to 0.3 and has a refractive index of about 3.35 to 3.48 at 940 nm, for example, and the second cladding layer 541 is of p-type GaAlAs with x of about 0.4 to 0.6, and has a refractive index of about 3.17 to 3.29 at 940 nm, for example.

The contact layer 570 is also, preferably, of a p-type III-V semiconductor compound. More preferably, the contact layer 570 is of a heavily doped $p^+$-type III-V semiconductor compound. In a preferred embodiment, the contact layer 570 is of $p^+$-type GaAs and has a refractive index of about 3.55 at 940 nm, for example.

Figure 6:
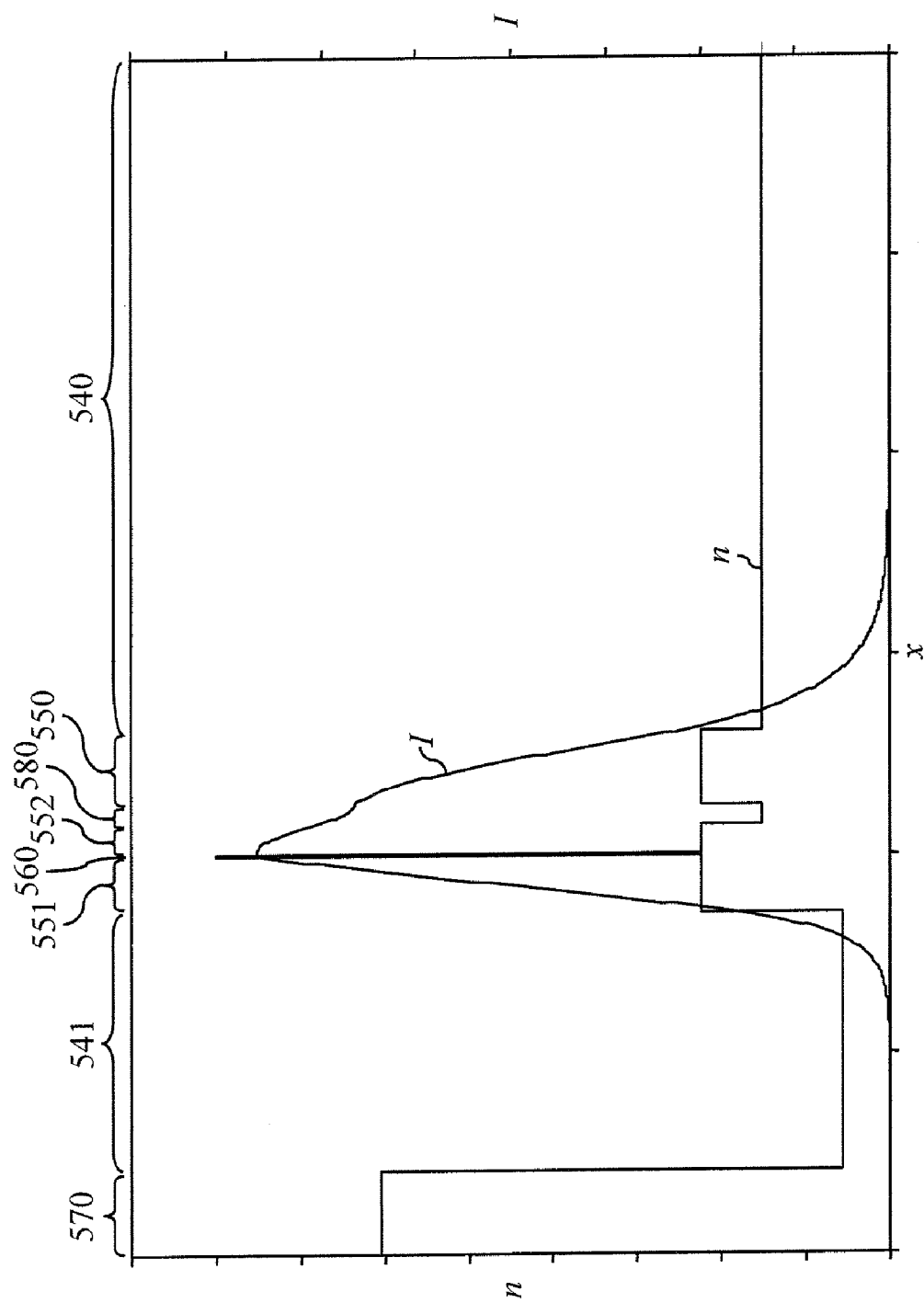
FIG. 6 is a plot of refractive index and optical-mode intensity as a function of distance from a second metal layer along a vertical axis through the laser diode of FIG. 5.

In FIG. 6, refractive index n and optical-mode intensity I are each plotted as a function of distance x from the second metal layer 511 along a vertical axis 590 through the laser diode 500 of FIG. 5. Within the layer stack 530, the active layer 560 and the contact layer 570 have respective refractive indices that are each greater than the respective refractive indices of the other layers in the layer stack 530. The first waveguide layer 550, the second waveguide layer 552, and the third waveguide layer 551 have a substantially equal refractive index, and the first cladding layer 540, the mode-splitting layer 580, and the second cladding layer 541 have respective refractive indices that are each less than the refractive index of the first waveguide layer 550, the second waveguide layer 552, and the third waveguide layer 551. Preferably, the refractive index of the mode-splitting layer 580 is at least 0.01 less than the refractive index of the first waveguide layer 550, the second waveguide layer 552, and the third waveguide layer 551.

Preferably, the refractive index of the mode-splitting layer 580 and the refractive index of the second cladding layer 541 are each less than or equal to the refractive index of the first cladding layer 540. In the illustrated embodiment, the refractive index of the mode-splitting layer 580 is substantially equal to the refractive index of the first cladding layer 540, and the refractive index of the second cladding layer 541 is less than the refractive index of the first cladding layer 540. Such an asymmetric refractive-index profile skews the optical mode toward the portion of the layer stack 530 that is of n-type semiconductor material, reducing optical loss due to free-carrier absorption.

The refractive-index profile of the layer stack 530 ensures that the optical mode generated in the active layer 560 is largely confined by the first cladding layer 540 and the second cladding layer 541 to propagate mainly in the first waveguide layer 550, the mode-splitting layer 580, the second waveguide layer 552, the active layer 560, and the third waveguide layer 551. The optical mode is emitted as an output beam from an edge facet of the laser diode 500 perpendicular to a horizontal plane of the active layer 560.

Advantageously, the mode-splitting layer 580 splits the optical mode, producing a shoulder, such that vertical overlap of the optical mode with the active layer 560 is increased. Consequently, the vertical optical confinement factor of the laser diode 500 is also increased. Preferably, an intensity maximum of the optical mode is positioned in the active layer 560, and the shoulder is positioned in the first waveguide layer 550.

The thickness profile of the layer stack 530 ensures a good vertical overlap of the optical mode with the active layer 560. Preferably, the first waveguide layer 550, the mode-splitting layer 580, the second waveguide layer 552, and the third waveguide layer 551 have respective thicknesses that are selected to position the intensity maximum of the optical mode in the active layer 560. Typically, the thickness of the mode-splitting layer 580 is greater than or equal to 10% of a sum of the thickness of the first waveguide layer 550 and the thickness of the second waveguide layer 552.

Preferably, the thickness of the third waveguide layer 551 is less than or equal to the sum of the thickness of the first waveguide layer 550 and the thickness of the second waveguide layer 552. In the illustrated embodiment, the thickness of the third waveguide layer 551 is less than the sum of the thickness of the first waveguide layer 550 and the thickness of the second waveguide layer 552. Such an asymmetric thickness profile skews the optical mode toward the portion of the layer stack 530 that is of n-type semiconductor material, reducing optical loss due to free-carrier absorption.

Figure 1:
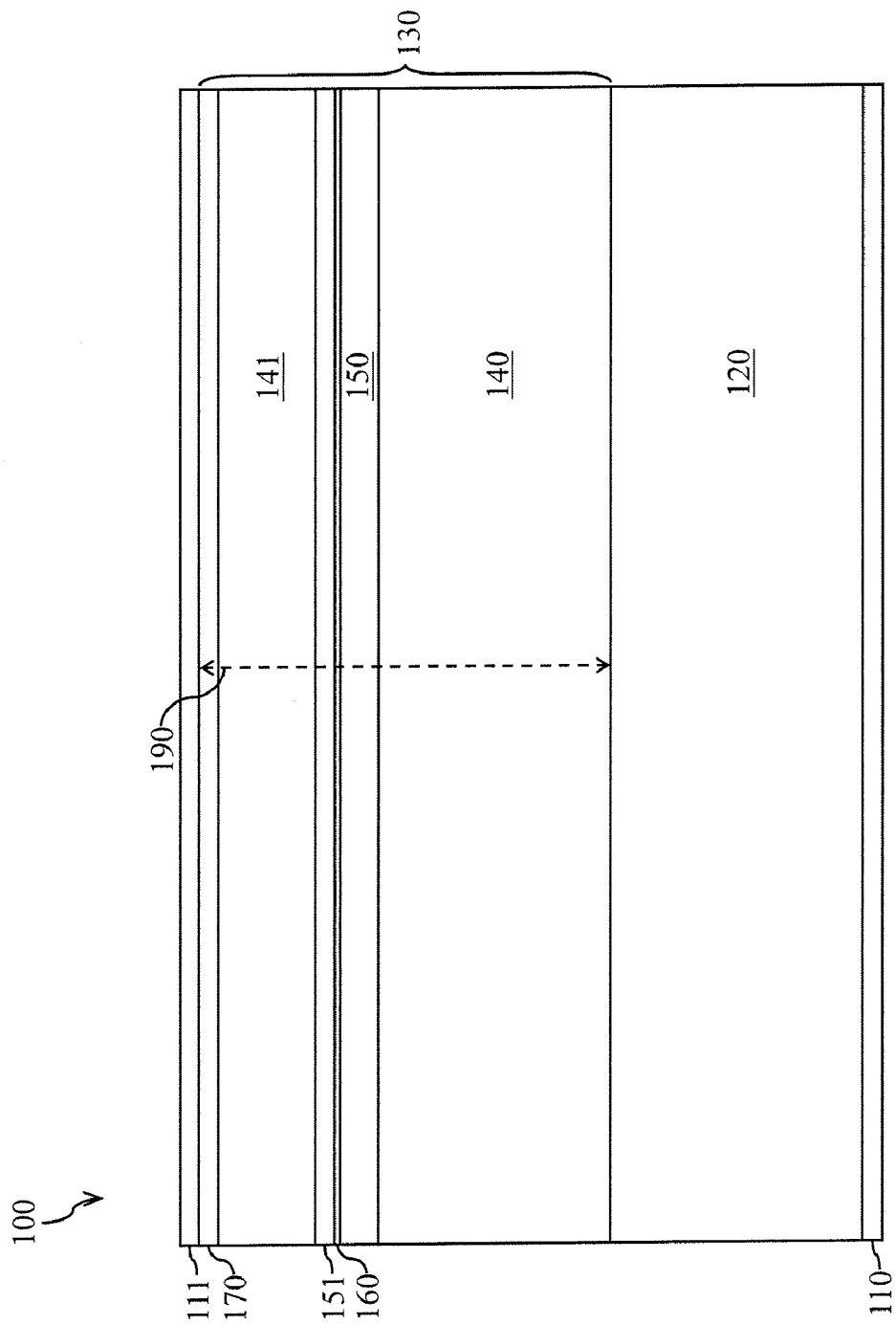
FIG. 1 is a schematic illustration of a cross-section of a first prior-art laser diode.
Figure 2:
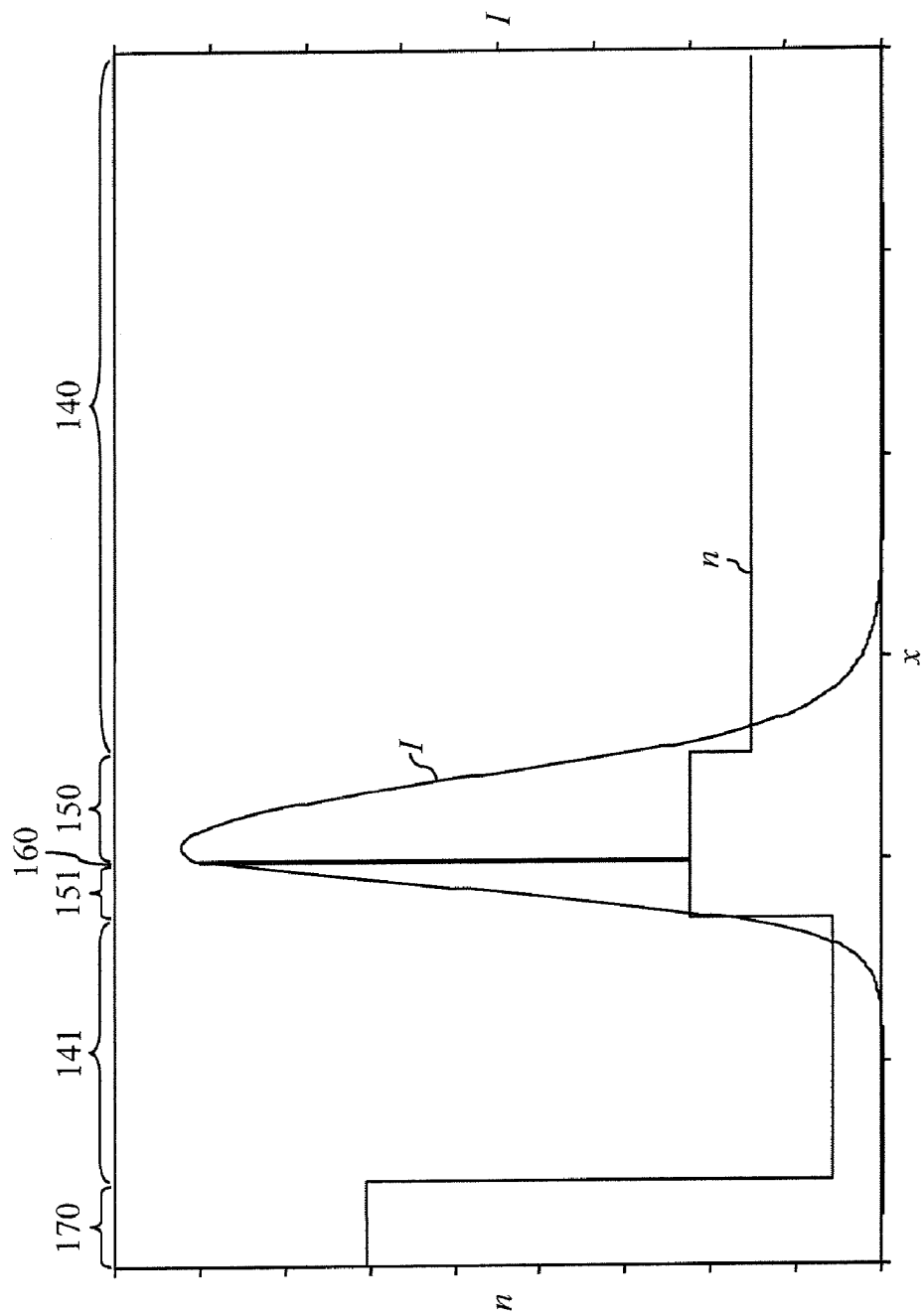
FIG. 2 is a plot of refractive index and optical-mode intensity as a function of distance from a second metal layer along a vertical axis through the prior-art laser diode of FIG. 1.
Figure 3:
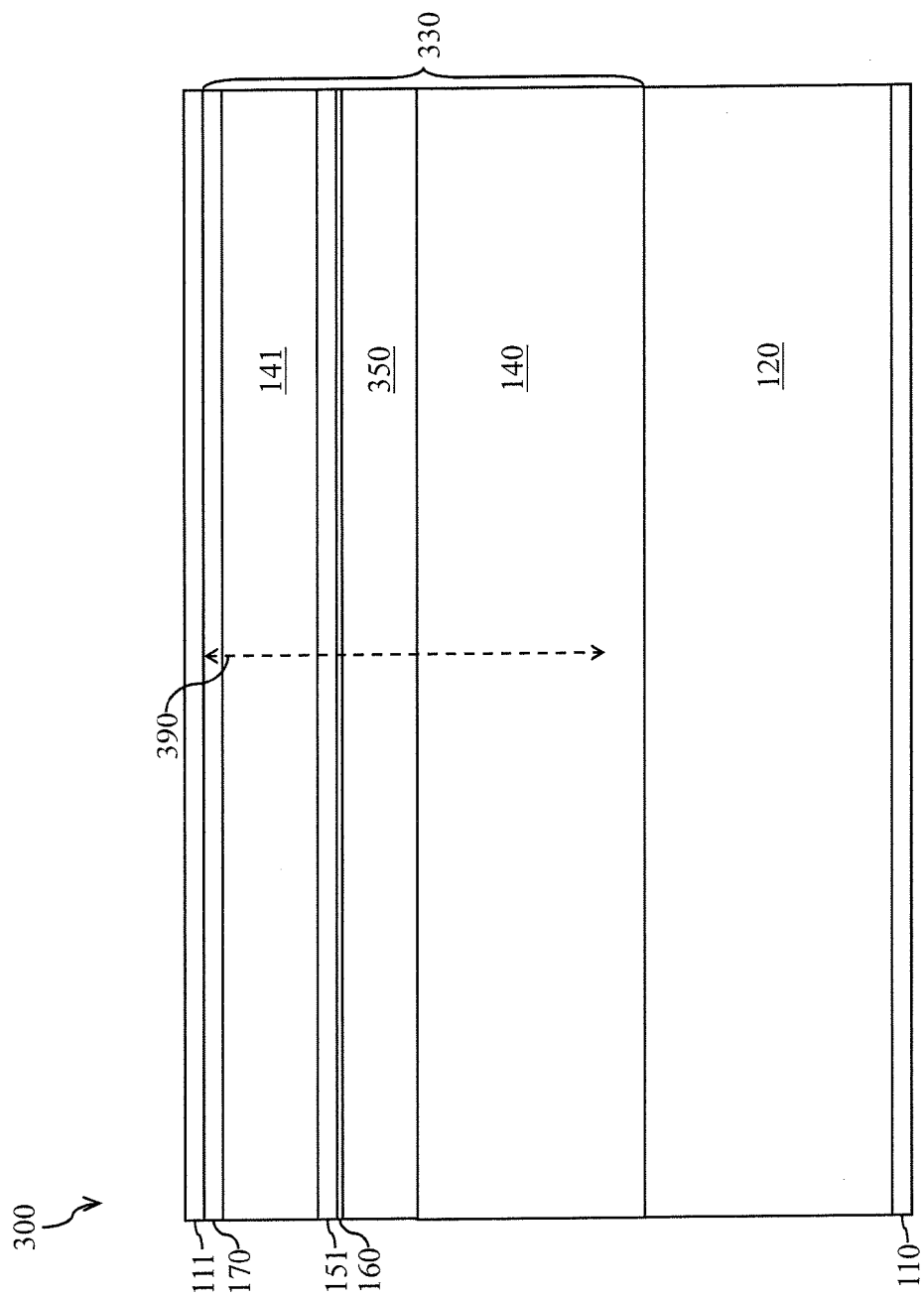
FIG. 3 is a schematic illustration of a cross-section of a second prior-art laser diode.
Figure 4:
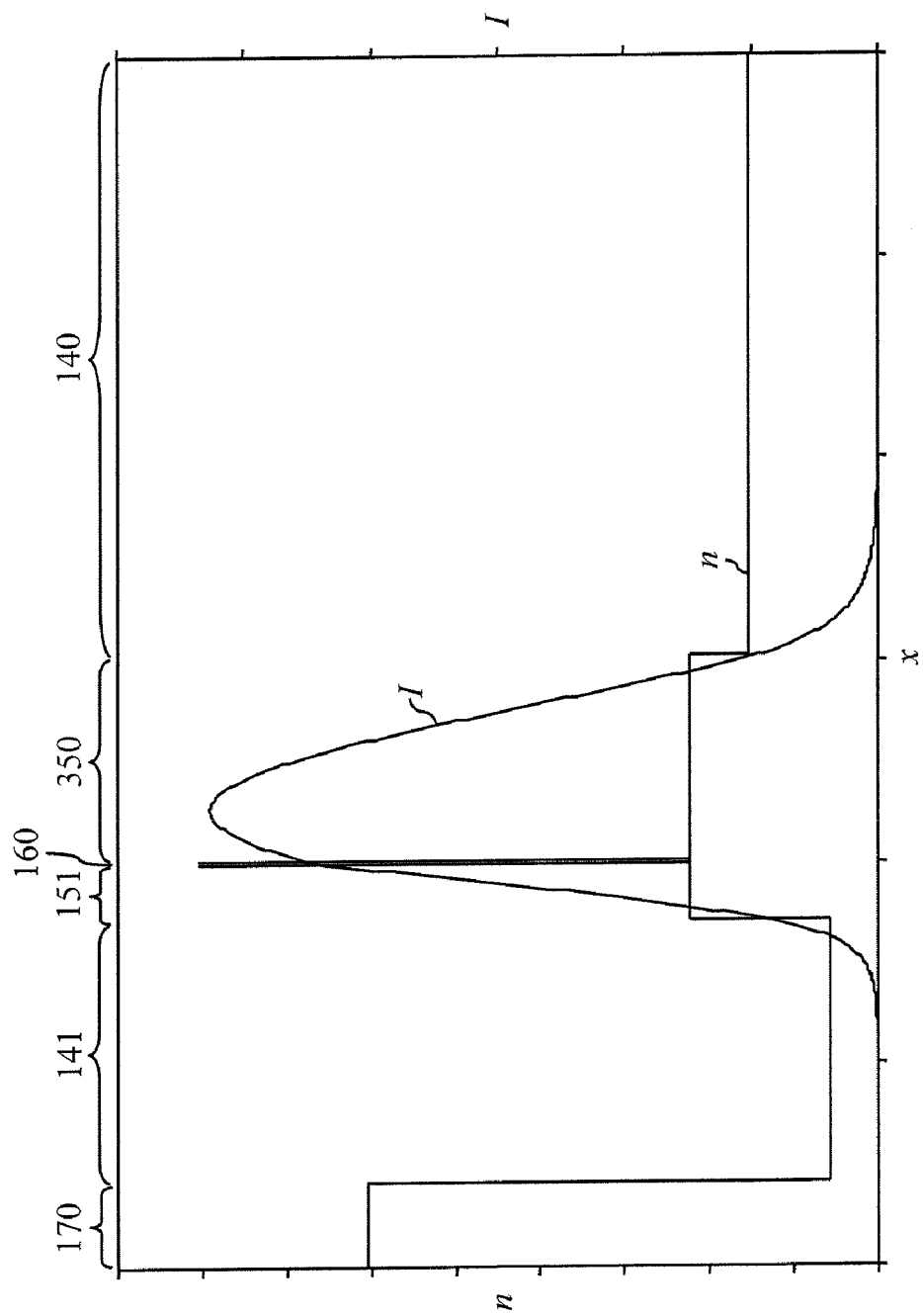
FIG. 4 is a plot of refractive index and optical-mode intensity as a function of distance from a second metal layer along a vertical axis through the prior-art laser diode of FIG. 3.

Comparison of FIG. 6 with FIG. 2 reveals that, in the laser diode 500, the vertical intensity profile of the optical mode is wider than that in the prior-art laser diode 100, whereas vertical overlap of the optical mode with the active layer 560 in the laser diode 500 is similar to that in the prior-art laser diode 100. Thus, advantageously, insertion of the mode-splitting layer 580 between the first waveguide layer 550 and the second waveguide layer 552 leads to an increased vertical near-field beam width and a decreased vertical far-field beam divergence of the laser diode 500 relative to those of the prior-art laser diode 100, while the vertical optical confinement factor of the laser diode 500 remains similar to that of the prior-art laser diode 100.

Figure 7:
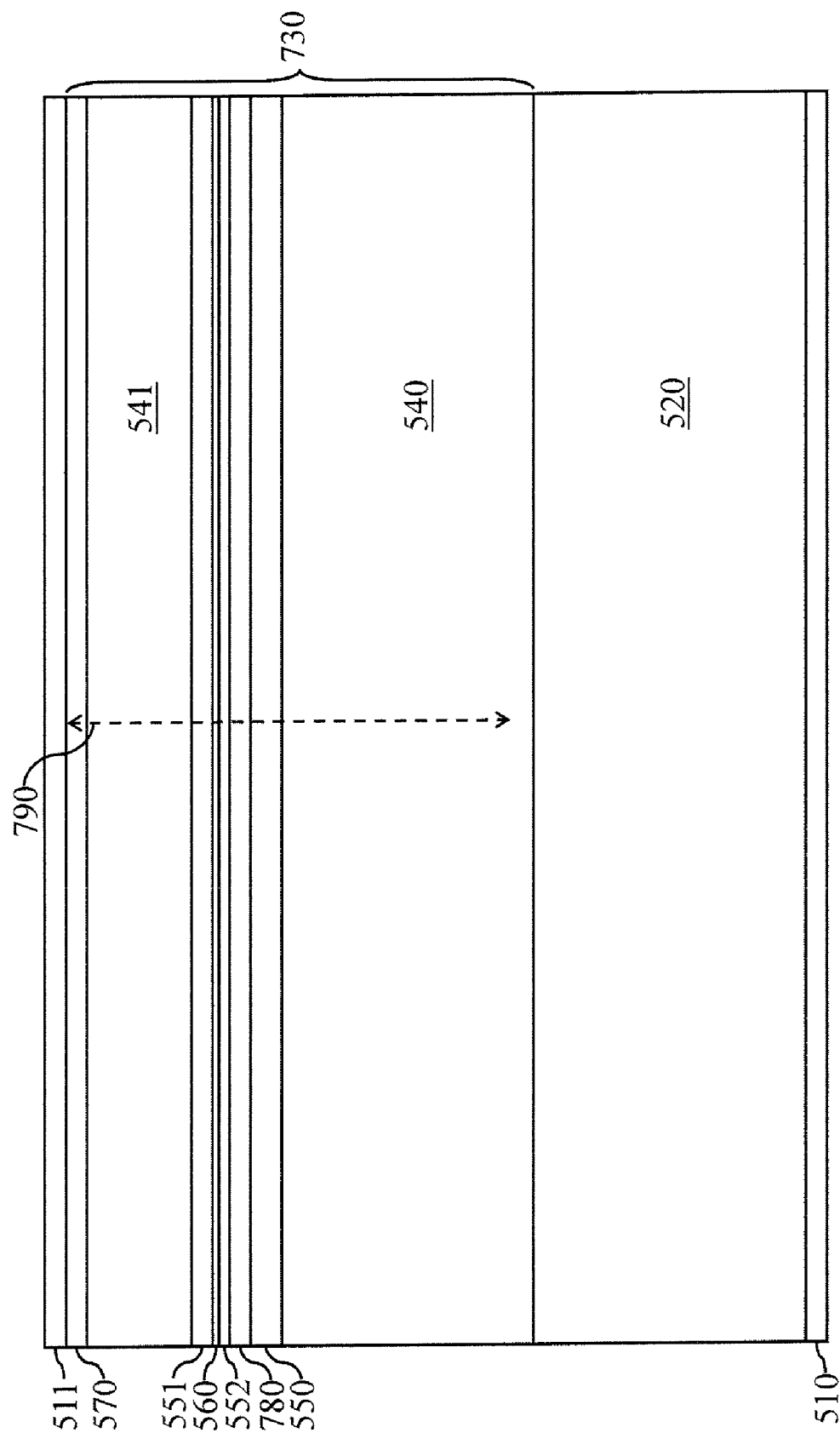
FIG. 7 is a schematic illustration of a cross-section of a laser diode according to a second embodiment of the present invention.

With reference to FIG. 7, a laser diode 700 according to a second embodiment of the present invention comprises a layer stack 730 including a mode-splitting layer 780 that has a thickness that is two times the thickness of the mode-splitting layer 580 of the laser diode 500. The layer stack 730 is otherwise similar to that of the laser diode 500.

Figure 8:
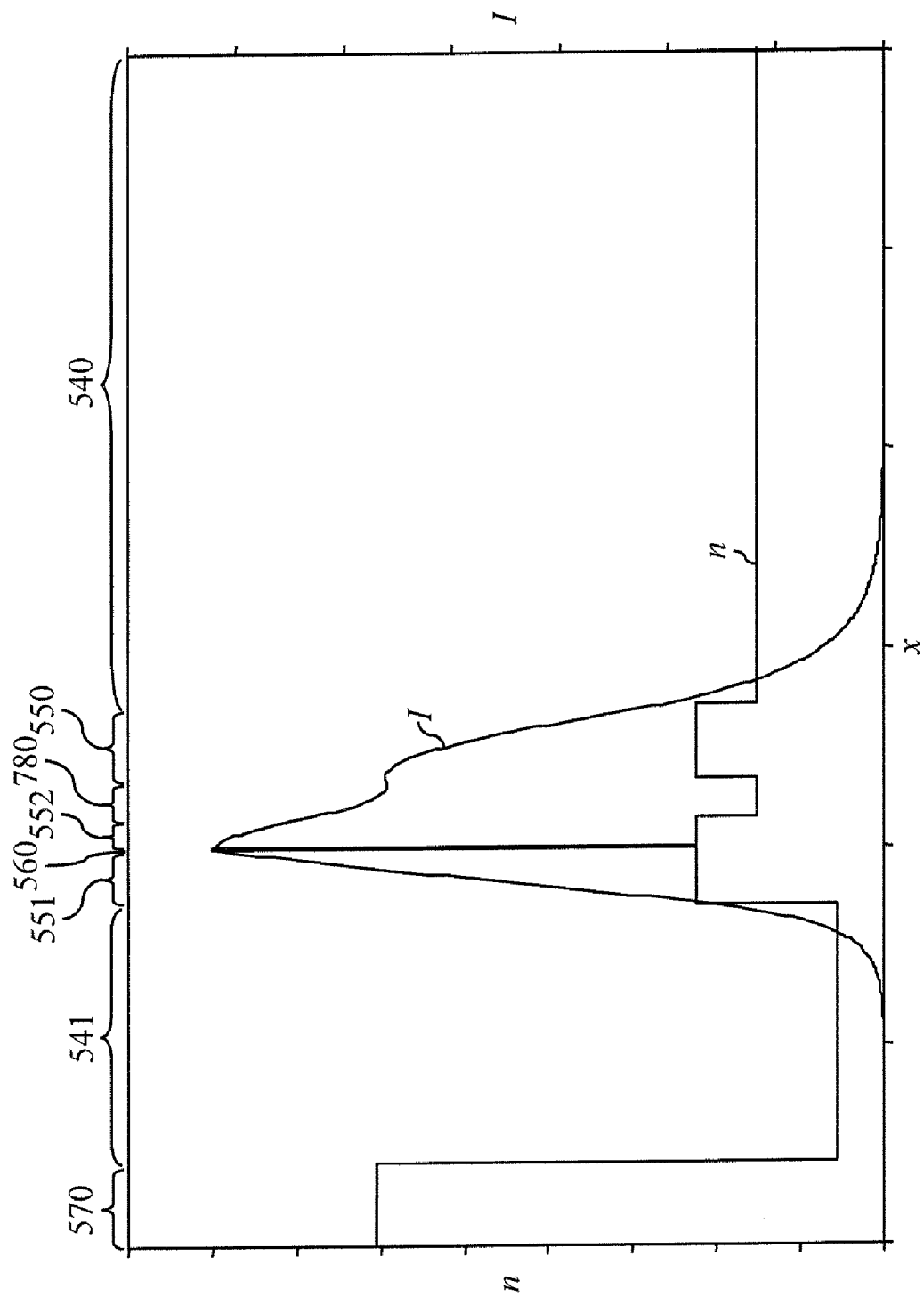
FIG. 8 is a plot of refractive index and optical-mode intensity as a function of distance from a second metal layer along a vertical axis through the laser diode of FIG. 7.

In FIG. 8, refractive index n and optical-mode intensity I are each plotted as a function of distance x from the second metal layer 511 along a vertical axis 790 through the laser diode 700 of FIG. 7. Comparison of FIG. 8 with FIG. 6 reveals that, in the laser diode 700, the vertical intensity profile of the optical mode is wider than that in the laser diode 500, whereas vertical overlap of the optical mode with the active layer 560 in the laser diode 700 is only slightly decreased relative to that in the laser diode 500. Thus, the increased thickness of the mode-splitting layer 780 leads to an increased vertical near-field beam width and a decreased vertical far-field beam divergence of the laser diode 700 relative to those of the laser diode 500, while the vertical optical confinement factor of the laser diode 700 is only slightly decreased relative to that of the laser diode 500.

Figure 9:
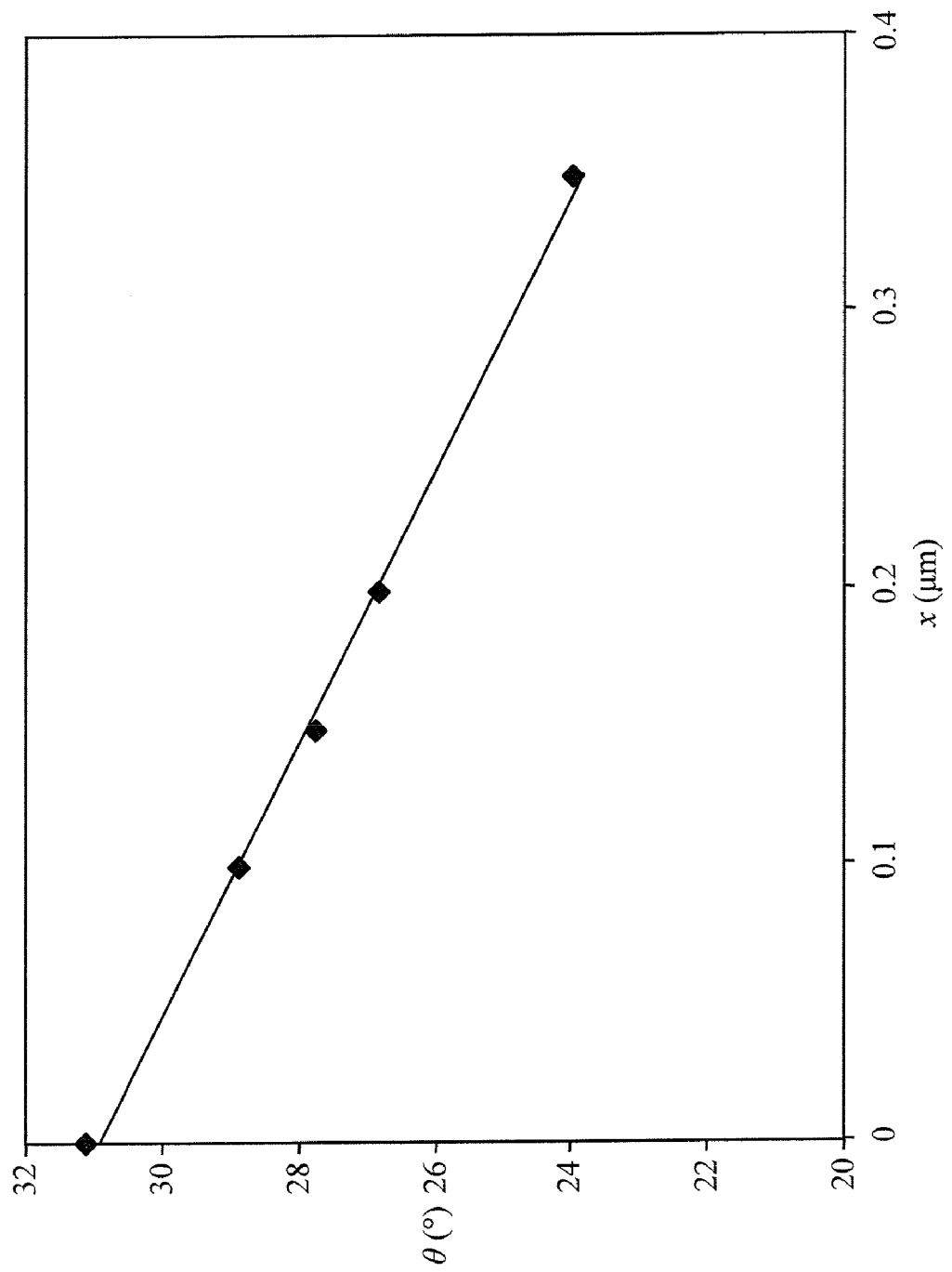
FIG. 9 is a plot of vertical far-field beam divergence as a function of mode-splitting-layer thickness for laser diodes according to embodiments of the present invention.

In FIG. 9, vertical far-field beam divergence $\theta$, measured on the basis of a full-width at half-maximum (FWHM) vertical far-field beam width, is plotted as a function of mode-splitting-layer thickness x for laser diodes according to embodiments of the present invention. As mode-splitting-layer thickness increases from 0 to about 0.35 μm, vertical far-field beam divergence decreases from about 31.1° to about 23.9°. Thus, the vertical far-field beam divergence of laser diodes according to embodiments of the present invention can be decreased significantly by increasing the thickness of a mode-splitting layer.

Figure 10:
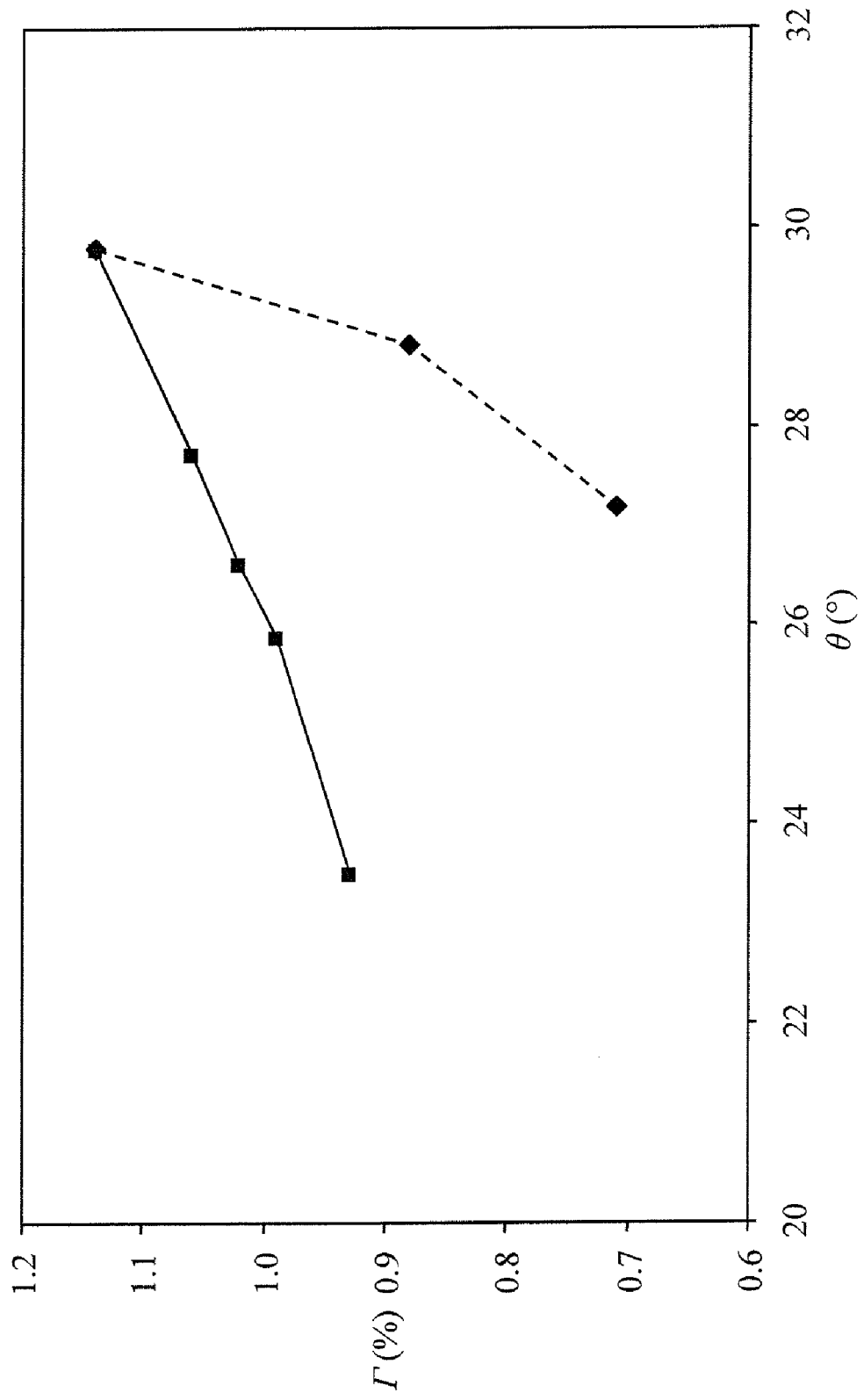
FIG. 10 is a plot of vertical optical confinement factor as a function of vertical far-field beam divergence for prior-art laser diodes and for laser diodes according to embodiments of the present invention.

In FIG. 10, vertical optical confinement factor $\Gamma$ is plotted as a function of vertical far-field beam divergence $\theta$, measured on the basis of a full-width at half-maximum (FWHM) vertical far-field beam width, for prior-art laser diodes, for which data points are illustrated as diamonds connected by a dashed line, and for laser diodes according to embodiments of the present invention, for which data points are illustrated as squares connected by a solid line.

For prior-art laser diodes similar to the laser diodes 100 and 300, which do not include a mode-splitting layer, as vertical far-field beam divergence decreases from about 29.8° to about 27.2°, as a result of increasing the thickness of a first waveguide layer, vertical optical confinement factor decreases rapidly from about 1.14% to about 0.71%. In contrast, for laser diodes according to embodiments of the present invention, as vertical far-field beam divergence decreases from about 29.8° to about 23.5°, as a result of increasing the thickness of a mode-splitting layer, vertical optical confinement factor decreases gradually from about 1.14% to about 0.93%. Thus, laser diodes according to embodiments of the present invention offer a clear advantage over prior-art laser diodes, in terms of increased vertical optical confinement factor for a given vertical far-field beam divergence.

Preferably, laser diodes according to embodiments of the present invention have a vertical far-field beam divergence of less than about 29° and a vertical optical confinement factor of greater than about 0.9%. More preferably, the vertical optical confinement factor of laser diodes according to embodiments of the present invention is greater than 0.95%.

The present invention also provides a method of fabricating a laser diode having both a small vertical far-field beam divergence and a large vertical optical confinement factor. The advantageous features of the method provided by the present invention will be described herein in the context of the fabrication of exemplary, preferred embodiments of the laser diode. However, those skilled in the art will appreciate that these advantageous features could also be applied to the fabrication of laser diodes having other specific structures. Furthermore, the advantageous features of the method could also be applied in an order different from that described herein.

With reference to FIGS. 5 and 7, in a method of fabricating the laser diodes 500 and 700, typically, the substrate 520 is provided, and the layer stack 530 or 730 is epitaxially grown on the top surface of the substrate 520. Epitaxial growth of the layer stack 530 or 730 is, preferably, performed by metal-organic chemical vapor deposition (MOCVD) or by molecular beam epitaxy (MBE).

Preferably, epitaxial growth of the layer stack 530 or 730 includes epitaxially growing the first cladding layer 540, epitaxially growing the first waveguide layer 550 on the top surface of the first cladding layer 540, epitaxially growing the mode-splitting layer 580 or 780 on the top surface of the first waveguide layer 550, epitaxially growing the second waveguide layer 552 on the top surface of the mode-splitting layer 580 or 780, epitaxially growing the active layer 560 on the top surface of the second waveguide layer 552, epitaxially growing the third waveguide layer 551 on the top surface of the active layer 560, and epitaxially growing the second cladding layer 541 on the top surface of the third waveguide layer 551. More preferably, the first cladding layer 540 is epitaxially grown at the bottom of the layer stack 530 or 730, and the contact layer 570 is epitaxially grown on the top surface of the second cladding layer 541 at the top of the layer stack 530 or 730.

Typically, an active strip is formed in the active layer 560. In some instances, when the laser diode 500 or 700 has a ridge structure, a ridge is etched to define the active strip, as is well-known to those skilled in the art. In other instances, when the laser diode 500 or 700 has planar structure, ion implantation, dopant diffusion, or epitaxial regrowth is performed to define the active strip, as is also well-known to those skilled in the art.

Typically, the first metal layer 510 is deposited on the bottom surface of the substrate 520, and the second metal layer 511 is deposited on the top surface of the layer stack 530 or 730. Deposition of the first metal layer 510 and the second metal layer 511 is, preferably, performed by physical vapor deposition (PVD) or by chemical vapor deposition (CVD).

Of course, numerous other embodiments of the present invention may be envisaged without departing from the spirit and scope of the invention.

I claim:

1. A laser diode comprising:
   a layer stack of semiconductor material, including, in succession:
     a first cladding layer, for confining an optical mode;
     a first waveguide layer, for propagating the optical mode;
     a mode-splitting layer, for splitting the optical mode to produce an intensity maximum and a shoulder;
     a second waveguide layer, for propagating the optical mode;
     an active layer, for generating the optical mode;
     a third waveguide layer, for propagating the optical mode; and
     a second cladding layer, for confining the optical mode;
   wherein the first waveguide layer, the mode-splitting layer, the second waveguide layer, and the third waveguide layer have respective thicknesses that are selected to position the intensity maximum in the active layer and the shoulder in the first waveguide layer;
   wherein the first waveguide layer, the second waveguide layer, and the third waveguide layer have a substantially equal refractive index; and
   wherein the first cladding layer, the mode-splitting layer, and the second cladding layer have respective refractive indices that are each less than the refractive index of the first waveguide layer, the second waveguide layer, and the third waveguide layer.

2. The laser diode of claim 1, wherein the layer stack includes the first cladding layer, the first waveguide layer, the mode-splitting layer, the second waveguide layer, the active layer, the third waveguide layer, and the second cladding layer in direct succession.

3. The laser diode of claim 1, further comprising a substrate of semiconductor material; wherein the layer stack is disposed on a top surface of the substrate; wherein the first waveguide layer is disposed on a top surface of the first cladding layer; wherein the mode-splitting layer is disposed on a top surface of the first waveguide layer; wherein the second waveguide layer is disposed on a top surface of the mode-splitting layer; wherein the active layer is disposed on a top surface of the second waveguide layer; wherein the third waveguide layer is disposed on a top surface of the active layer; and wherein the second cladding layer is disposed on a top surface of the third waveguide layer.

4. The laser diode of claim 3, wherein the layer stack further includes a contact layer, for facilitating ohmic contacting; wherein the first cladding layer is disposed at a bottom of the layer stack; and wherein the contact layer is disposed on a top surface of the second cladding layer at a top of the layer stack.

5. The laser diode of claim 1, wherein the first cladding layer, the first waveguide layer, the mode-splitting layer, and the second waveguide layer are of n-type semiconductor material; wherein the active layer is of intrinsic semiconductor material; and wherein the third waveguide layer and the second cladding layer are of p-type semiconductor material.

6. The laser diode of claim 5, wherein the first cladding layer is of n-type $Ga_{1-x}Al_xAs$ with x of about 0.3 to 0.5; wherein the first waveguide layer and the second waveguide layer are of n-type $Ga_{1-x}Al_xAs$ with x of about 0.1 to 0.3; wherein the mode-splitting layer is of n-type $Ga_{1-x}Al_xAs$ with x of about 0.2 to 0.5; wherein the third waveguide layer is of p-type $Ga_{1-x}Al_xAs$ with x of about 0.1 to 0.3; and wherein the second cladding layer is of p-type $Ga_{1-x}Al_xAs$ with x of about 0.4 to 0.6.

7. The laser diode of claim 6, wherein the active layer includes one or more quantum-well layers of intrinsic $In_xGa_{1-x}As$ with x of about 0.05 to 0.15.

8. The laser diode of claim 1, wherein the active layer has a refractive index that is greater than the refractive index of the first waveguide layer, the second waveguide layer, and the third waveguide layer, the refractive index of the first cladding layer, the refractive index of the mode-splitting layer, and the refractive index of the second cladding layer.

9. The laser diode of claim 1, wherein the refractive index of the mode-splitting layer is at least 0.01 less than the refractive index of the first waveguide layer, the second waveguide layer, and the third waveguide layer.

10. The laser diode of claim 1, wherein the refractive index of the mode-splitting layer and the refractive index of the second cladding layer are each less than or equal to the refractive index of the first cladding layer.

11. The laser diode of claim 10, wherein the refractive index of the second cladding layer is less than the refractive index of the first cladding layer.

12. The laser diode of claim 11, wherein the refractive index of the mode-splitting layer is substantially equal to the refractive index of the first cladding layer.

13. The laser diode of claim 1, wherein the thickness of the first waveguide layer is of about 0.2 μm to 1.0 μm; wherein the thickness of the mode-splitting layer is of about 0.05 μm to 0.4 μm; wherein the thickness of the second waveguide layer is of about 0.1 μm to 0.3 μm; and wherein the thickness of the third waveguide layer is of about 0.2 μm to 0.4 μm.

14. The laser diode of claim 13, wherein the thickness of the mode-splitting layer is of about 0.1 μm to 0.2 μm.

15. The laser diode of claim 1, wherein the thickness of the mode-splitting layer is greater than or equal to 10% of a sum of the thickness of the first waveguide layer and the thickness of the second waveguide layer.

16. The laser diode of claim 1, wherein the thickness of the third waveguide layer is less than or equal to a sum of the thickness of the first waveguide layer and the thickness of the second waveguide layer.

17. The laser diode of claim 16, wherein the thickness of the third waveguide layer is less than the sum of the thickness of the first waveguide layer and the thickness of the second waveguide layer.

18. The laser diode of claim 1, wherein the laser diode has a vertical far-field beam divergence of less than about 29° and a vertical optical confinement factor of greater than about 0.9%.

19. A method of fabricating a laser diode comprising:
providing a substrate of semiconductor material; and
epitaxially growing a layer stack of semiconductor material on a top surface of the substrate, including:
    epitaxially growing a first cladding layer, for confining an optical mode;
    epitaxially growing a first waveguide layer, for propagating the optical mode, on a top surface of the first cladding layer;
    epitaxially growing a mode-splitting layer, for splitting the optical mode to produce an intensity maximum and a shoulder, on a top surface of the first waveguide layer;
    epitaxially growing a second waveguide layer, for propagating the optical mode, on a top surface of the mode-splitting layer;
    epitaxially growing an active layer, for generating the optical mode, on a top surface of the second waveguide layer;
    epitaxially growing a third waveguide layer, for propagating the optical mode, on a top surface of the active layer; and
    epitaxially growing a second cladding layer, for confining the optical mode, on a top surface of the third waveguide layer;
    wherein the first waveguide layer, the mode-splitting layer, the second waveguide layer, and the third waveguide layer have respective thicknesses that are selected to position the intensity maximum in the active layer and the shoulder in the first waveguide layer;
    wherein the first waveguide layer, the second waveguide layer, and the third waveguide layer have a substantially equal refractive index; and
    wherein the first cladding layer, the mode-splitting layer, and the second cladding layer have respective refractive indices that are each less than the refractive index of the first waveguide layer, the second waveguide layer, and the third waveguide layer.

* * * * *